US011837574B2

(12) United States Patent
Sugakawa et al.

(10) Patent No.: US 11,837,574 B2
(45) Date of Patent: Dec. 5, 2023

(54) BONDING APPARATUS AND BONDING METHOD (71) Applicant: Tokyo Electron Limited, Tokyo (JP)

(72) Inventors: Kenji Sugakawa, Koshi (JP); Yosuke Omori, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 232 days.

(21) Appl. No.: 17/320,338

(22) Filed: May 14, 2021

(65) Prior Publication Data

US 2021/0358879 A1 Nov. 18, 2021

(30) Foreign Application Priority Data

May 15, 2020 (JP) ................... 2020-086324

(51) Int. Cl.
*H01L 21/84* (2006.01)
*H01L 23/00* (2006.01)

(52) U.S. Cl.
CPC .............. *H01L 24/75* (2013.01); *H01L 24/83* (2013.01); *H01L 2224/751* (2013.01); *H01L 2224/7555* (2013.01); *H01L 2224/83894* (2013.01)

(58) Field of Classification Search
CPC ... H01L 24/75; H01L 24/83; H01L 2224/751; H01L 2224/7555; H01L 2224/83894; H01L 2224/7501; H01L 2224/7518; H01L 2224/75252; H01L 2224/753; H01L 2224/75744; H01L 2224/75745; H01L 2224/75901; H01L 2224/80009; H01L 2224/80013; H01L 2224/94; H01L 24/80; H01L 24/94; H01L 21/187; H01L 21/67011; H01L 21/6838; H01L 21/67092; H01L 21/67109; B23K 20/00
USPC ........................................... 438/457
See application file for complete search history.

(56) References Cited

U.S. PATENT DOCUMENTS

| 7,160,392 | B2 * | 1/2007 | Shang ................... C23C 16/458 |
| | | | 156/345.23 |
| 9,646,860 | B2 * | 5/2017 | Huang .............. H01L 21/67092 |
| 9,741,595 | B2 * | 8/2017 | Sugakawa ......... H01L 21/67248 |
| 10,049,901 | B2 * | 8/2018 | Liu ........................ B23B 31/305 |
| 10,279,575 | B2 * | 5/2019 | Wagenleitner ....... B32B 38/1833 |
| 10,755,929 | B2 * | 8/2020 | Wagenleitner ....... B81C 1/00269 |
| 10,833,047 | B2 * | 11/2020 | Kim .................. H01L 21/67253 |
| 10,906,283 | B2 * | 2/2021 | Kim ....................... B32B 37/003 |
| 10,923,452 | B2 * | 2/2021 | Han .................. H01L 21/67253 |
| 11,056,356 | B1 * | 7/2021 | Mueller ................. C03C 27/06 |
| 11,201,098 | B2 * | 12/2021 | Kürten ................ H01L 23/3735 |
| 2021/0057263 | A1 * | 2/2021 | Kim .................. H01L 21/68735 |

FOREIGN PATENT DOCUMENTS

JP 2015-153954 A 8/2015

* cited by examiner

*Primary Examiner* — Vu A Vu (74) *Attorney, Agent, or Firm* — Pearne & Gordon LLP (57) ABSTRACT A bonding apparatus includes a holder; a pressing member; and a curvature adjuster. The holder is configured to attract and hold a substrate to be bonded. The pressing member is configured to come into contact with a central portion of the substrate attracted to and held by the holder and press the substrate to allow the central portion of the substrate to be protruded. The curvature adjuster is configured to adjust a curvature of the substrate pressed by the pressing member.

8 Claims, 5 Drawing Sheets

BONDING APPARATUS AND BONDING METHOD

CROSS-REFERENCE TO RELATED APPLICATION

This application claims the benefit of Japanese Patent Application No. 2020-086324 filed on May 15, 2020, the entire disclosure of which is incorporated herein by reference.

TECHNICAL FIELD

The various aspects and embodiments described herein pertain generally to a bonding apparatus and a bonding method.

BACKGROUND

Patent Document 1 describes a technique of starting bonding of a first substrate and a second substrate in a state that a central portion of the first substrate is protruded toward the second substrate by being pressed with a pressing member.

Patent Document 1: Japanese Patent Laid-open Publication No. 2015-153954

SUMMARY

In one exemplary embodiment, a bonding apparatus includes a holder; a pressing member; and a curvature adjuster. The holder is configured to attract and hold a substrate to be bonded. The pressing member is configured to come into contact with a central portion of the substrate attracted to and held by the holder and press the substrate to allow the central portion of the substrate to be protruded. The curvature adjuster is configured to adjust a curvature of the substrate pressed by the pressing member.

The foregoing summary is illustrative only and is not intended to be any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Hereinafter, embodiments for a bonding apparatus and a bonding method according to the present disclosure (hereinafter, referred to as "exemplary embodiments") will be described in detail with reference to the accompanying drawings. Further, it should be noted that the bonding apparatus and the bonding method according to the present disclosure are not limited by the exemplary embodiments. Further, unless processing contents are contradictory, the various exemplary embodiments can be appropriately combined. Furthermore, in the various exemplary embodiments to be described below, same parts will be assigned same reference numerals, and redundant description will be omitted.

Further, in the following exemplary embodiments, expressions such as "constant," "perpendicular," "vertical" and "parallel" may be used. These expressions, however, do not imply strictly "constant", "perpendicular," "vertical" and "parallel". That is, these expressions allow some tolerable errors in, for example, manufacturing accuracy, installation accuracy, or the like.

Moreover, in the various accompanying drawings, for the purpose of clear understanding, there may be used a rectangular coordinate system in which the X-axis direction, Y-axis direction and Z-axis direction which are orthogonal to one another are defined and the positive Z-axis direction is defined as a vertically upward direction. Further, a rotational direction around a vertical axis may be referred to as "θ direction."

First Exemplary Embodiment

<Configuration of Bonding System>

Figure 1:
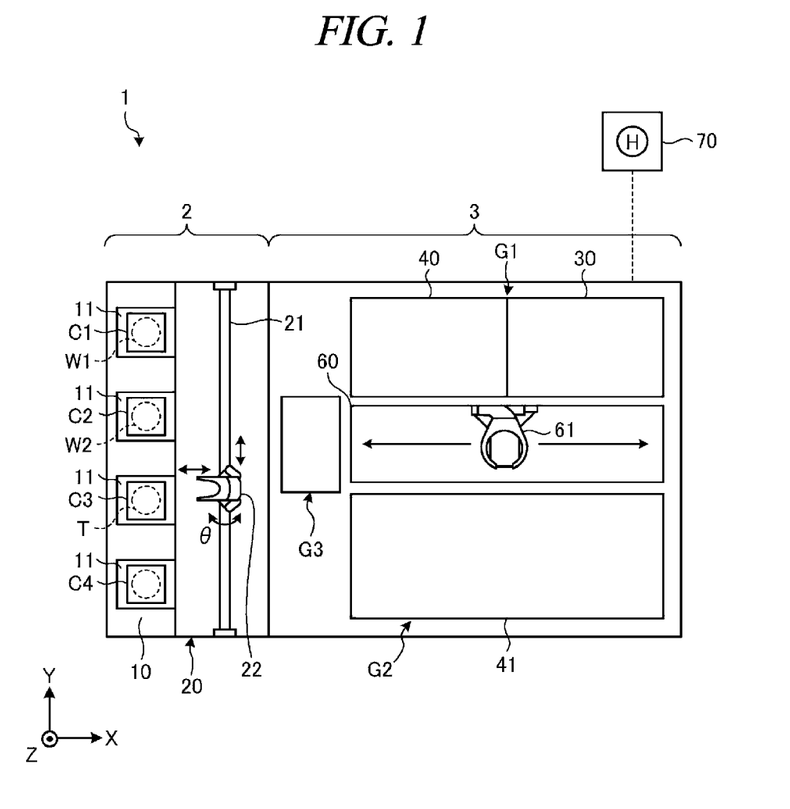
FIG. 1 is a schematic diagram illustrating a configuration of a bonding system according to a first exemplary embodiment.

First, a configuration of a boding system 1 according to a first exemplary embodiment will be described with reference to FIG. 1 and FIG. 2. FIG. 1 is a schematic diagram illustrating the configuration of the bonding system 1 according to the first exemplary embodiment. Further, FIG. 2 is a schematic diagram illustrating a state of a first substrate W1 and a second substrate W2 before they are bonded according to the first exemplary embodiment.

Figure 2:
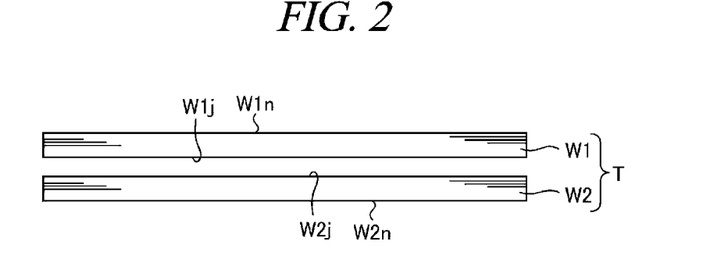
FIG. 2 is a schematic diagram illustrating a state of a first substrate and a second substrate before they are bonded according to the first exemplary embodiment.

The bonding system 1 shown in FIG. 1 forms a combined substrate T by bonding the first substrate W1 and the second substrate W2 (see FIG. 2).

The first substrate W1 and the second substrate W2 are single crystalline silicon wafers, and a multiple number of electronic circuits are formed on surfaces of these substrates. The first substrate W1 and the second substrate W2 have the substantially same diameter. Further, either one of the first substrate W1 and the second substrate W2 may be a bare substrate on which no electronic circuit is formed.

In the following description, as shown in FIG. 2, among surfaces of the first substrate W1, a surface to be bonded to the second substrate W2 will be referred to as "bonding surface W1j", and a surface opposite to the bonding surface W1j will be referred to as "non-bonding surface W1n". Further, among surfaces of the second substrate W2, a surface to be bonded to the first substrate W1 will be referred to as "bonding surface W2j", and a surface opposite to the bonding surface W2j will be referred to as "non-bonding surface W2n."

As depicted in FIG. 1, the bonding system 1 includes a carry-in/out station 2 and a processing station 3. The carry-in/out station 2 is disposed at the negative X-axis side of the processing station 3, and connected as a single body with the processing station 3.

The carry-in/out station 2 includes a placing table 10 and a transfer section 20. The placing table 10 is equipped with a multiple number of placing plates 11. Respectively provided on the placing plates 11 are cassettes C1 to C4 each of which accommodates therein a plurality of (e.g., 25 sheets of) substrates horizontally. The cassette C1 accommodates therein a plurality of first substrates W1; the cassette C2, a plurality of second substrates W2; and the cassette C3, a plurality of combined substrates T. The cassette C4 is a cassette for collecting, for example, a problematic substrate. Further, the number of the cassettes C1 to C4 placed on the placing plates 11 is not limited to the shown example.

The transfer section 20 is provided adjacent to the positive X-axis side of the placing table 10. Provided in the transfer section 20 are a transfer path 21 extending in the Y-axis direction and a transfer device 22 configured to be movable along the transfer path 21. The transfer device 22 is configured to be movable in the X-axis direction as well as in the Y-axis direction and pivotable around the Z-axis. The transfer device 22 is also configured to transfer the first substrates W1, the second substrates W2 and the combined substrates T between the cassettes C1 to C4 placed on the placing plates 11 and a third processing block G3 of the processing station 3 to be described later.

For example, three processing blocks G1, G2 and G3 are provided in the processing station 3. The first processing block G1 is disposed at a rear side (positive Y-axis side of FIG. 1) of the processing station 3, and the second processing block G2 is provided at a front side (negative Y-axis side of FIG. 1) of the processing station 3. Further, the third processing block G3 is disposed at a carry-in/out station 2 side (negative X-axis side of FIG. 1) of the processing station 3.

Provided in the first processing block G1 is a surface modifying apparatus 30 configured to modify the bonding surface W1j of the first substrate W1 and the bonding surface W2j of the second substrate W2. The surface modifying apparatus 30 forms a dangling bond on the bonding surface W1j of the first substrate W1 and the bonding surface W2j of the second substrate W2 by plasma radiation, thus allowing the bonding surfaces W1j and W2j to be modified such that they are easily hydrophilized afterwards.

Specifically, in the surface modifying apparatus 30, an oxygen gas or a nitrogen gas as a processing gas is excited into plasma under, for example, a decompressed atmosphere. As oxygen ions or nitrogen ions are radiated to the bonding surfaces W1j and W2j of the first and second substrates W1 and W2, the bonding surfaces W1j and W2j are modified by being plasma-processed.

Further, in the first processing block G1, a surface hydrophilizing apparatus 40 is disposed. The surface hydrophilizing apparatus 40 is configured to hydrophilize and clean the bonding surfaces W1j and W2j of the first substrate W1 and the second substrate W2 with, for example, pure water. To elaborate, the surface hydrophilizing apparatus 40 supplies the pure water onto the first substrate W1 or the second substrate W2 while rotating the first substrate W1 or the second substrate W2 held by, for example, a spin chuck. Accordingly, the pure water supplied onto the first substrate W1 or the second substrate W2 is diffused on the bonding surface W1j of the first substrate W1 or the bonding surface W2j of the second substrate W2, so that the bonding surfaces W1j and W2j are hydrophilized.

Here, though the surface modifying apparatus 30 and the surface hydrophilizing apparatus 40 are arranged side by side, the surface hydrophilizing apparatus 40 may be stacked on top of or under the surface modifying apparatus 30.

In the second processing block G2, a bonding apparatus 41 is disposed. The boning apparatus 41 is configured to bond the first substrate W1 and the second substrate W2, which are hydrophilized, by an intermolecular force. A specific configuration of the bonding apparatus 41 will be discussed later.

A transfer section 60 is formed in a region surrounded by the first processing block G1, the second processing block G2 and the third processing block G3. A transfer device 61 is disposed in the transfer section 60. The transfer device 61 is equipped with, for example, a transfer arm which is configured to be movable in a vertical direction and a horizontal direction and pivotable around a vertical axis. This transfer device 61 is moved within the transfer section 60 and transfers the first substrates W1, the second substrates W2 and the combined substrates T to preset devices within the first processing block G1, the second processing block G2 and the third processing block G3 which are adjacent to the transfer section 60.

Furthermore, the bonding system 1 includes a control device 70. The control device 70 controls an operation of the bonding system 1. This control device 70 may be implemented by, for example, a computer and includes a controller and a storage which are not illustrated. The controller includes a microcomputer having a CPU (Central Processing Unit), a ROM (Read Only Memory), a RAM (Random Access Memory), an input/output port, and so forth; and various kinds of circuits. The CPU of the microcomputer implements a control to be described later by reading out a program stored in the ROM and executing the program. Further, the storage may be implemented by, by way of non-limiting example, a semiconductor memory device such as a RAM or a flash memory, or a storage device such as a hard disk or an optical disk.

Further, the program may be recorded on a computer-readable recording medium and installed from the recording medium to the storage of the control device 70. The computer-readable recording medium may be, by way of non-limiting example, a hard disk HD, a flexible disk FD, a compact disk CD, a magnetic optical disk MO, a memory card, or the like.

<Bonding Apparatus>

Figure 3:
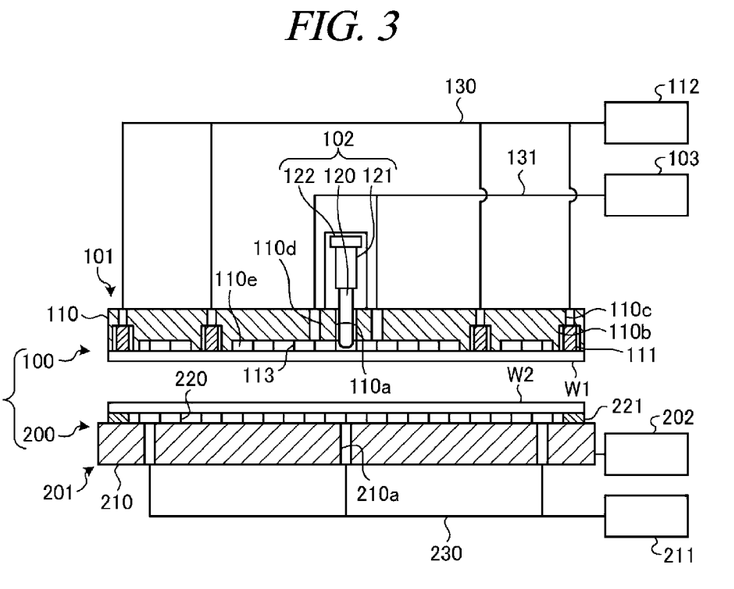
FIG. 3 is a schematic diagram illustrating a configuration of a bonding apparatus according to the first exemplary embodiment.

Now, the bonding apparatus 41 according to the first exemplary embodiment will be explained with reference to FIG. 3. FIG. 3 is a schematic diagram illustrating a configuration of the bonding apparatus 41 according to the first exemplary embodiment.

The bonding apparatus 41 is equipped with a first chuck 100 and a second chuck 200.

The first chuck 100 includes a holder 101, a striker 102 (an example of a pressing member), and an air supply 103 (an example of a curvature adjuster).

The holder 101 is configured to attract and hold the first substrate W1 to be bonded. The holder 101 attracts and holds the first substrate W1 from above it. To elaborate, the holder 101 holds the first substrate W1 by attracting the non-bonding surface Win of the first substrate W1.

The holder 101 is equipped with a main body 110, an attraction pad 111 and a suction device 112. The main body 110 is formed to have, for example, a circular shape. The main body 110 is provided with an insertion hole 110*a*, an accommodation portion 110*b*, a suction path 110*c* and a blow-out hole 110*d*.

The insertion hole 110*a* is formed in a central portion of the main body 110. The insertion hole 110*a* is formed along the vertical direction. The insertion hole 110*a* is formed through the main body 110. A pressing pin 120 of the striker 102 is inserted into this insertion hole 110*a*.

The accommodation portion 110*b* is formed to be opened at a bottom surface of the main body 110. The attraction pad 111 is accommodated in the accommodation portion 110*b*. The suction path 110*c* is connected to the attraction pad 111 accommodated in the accommodation portion 110*b*. To elaborate, one end of the suction path 110*c* is connected to the attraction pad 111 which is accommodated in the accommodation portion 110*b*. The other end of the suction path 110*c* is connected to the suction device 112 via a suction line 130.

The accommodation portion 110*b* and the suction path 110*c* are formed at an outer side of the first substrate W1 than the insertion hole 110*a* in a diametrical direction thereof, that is, in a diametrical direction of the main body 110.

The accommodation portion 110*b* and the suction path 110*c* are plural in number, and these accommodation portions 110*b* and the suction paths 110*c* are formed along a circumferential direction of the main body 110. The accommodation portions 110*b* and the suction paths 110*c* are arranged along two circles concentrically with respect to the insertion hole 110*a*.

The blow-out hole 110*d* is formed between the insertion hole 110*a*; and the accommodation portion 110*b* and the suction path 110*c*. The blow-out hole 110*d* is formed near the insertion hole 110*a*. The blow-out hole 110*d* is formed through the main body 110. The blow-out hole 110*d* is connected to the air supply 103 via a blow-out line 131 to supply high-pressure air toward the first substrate W1. The blow-out hole 110*d* is plural in number. These multiple blow-out holes 110*d* are formed along the circumferential direction of the main body 110. Further, the multiple blow-out holes 110*d* may be formed along the diametrical direction of the main body 110.

A recess 110*e* is formed in the bottom surface of the main body 110. A plurality of pins 113 is provided in this recess 110*e*. These pins 113 are in contact with a top surface of the first substrate W1, that is, the non-bonding surface Win of the first substrate W1.

The attraction pad 111 is accommodated in each accommodation portion 110*b*. That is, the attraction pad 111 is plural in number, and these attraction pads 111 are arranged along the circumferential direction of the main body 110. Further, the attraction pads 111 are arranged along two circles concentrically with respect to the insertion holes 110*a*. The attraction pads 111 are configured to attract a peripheral portion of the first substrate W1. As stated, the holder 101 is equipped with the multiple attraction pads 111 which are arranged along a circumferential direction of the holder 101.

The suction device 112 is, for example, a vacuum pump, and configured to vacuum-evacuate the inside of the attraction pads 111. As the inside of the attraction pads 111 is vacuum-evacuated, the non-bonding surface Win of the first substrate W1 is attracted to the attraction pads 111, so that the first substrate W1 is attracted to and held by the holder 101.

The striker 102 is disposed on a top surface of the main body 110, for example. The striker 102 is equipped with the pressing pin 120, an actuator 121 and a linearly moving mechanism 122. The striker 102 (the example of the pressing member) comes into contact with the first substrate W1 (an example of a substrate) to press the first substrates W1. The pressing pin 120 is a columnar member extending in the vertical direction and is supported by the actuator 121.

The actuator 121 is configured to generate a constant pressure vertically downwards by air supplied via, for example, an electro-pneumatic regulator (not shown). By the air supplied via the electro-pneumatic regulator, the actuator 121 is capable of coming into contact with the central portion of the first substrate W1 and controlling a pressing load applied to the central portion of the first substrate W1. Further, a leading end of the actuator 121 is vertically movable up and down through the insertion hole 110*a*.

The actuator 121 is supported by the linearly moving member 122. The linearly moving member 122 is configured to move the actuator 121 in the vertical direction by a driving unit having, for example, a motor embedded therein.

The striker 102 controls the pressing load applied to the first substrate W1 from the pressing pin 120 of the actuator 121 by controlling the movement of the actuator 121 with the linearly moving member 122. The striker 102 (the example of the pressing member) comes into contact with the central portion of the first substrate W1 (the example of the substrate) attracted to and held by the holder 101 to press the first substrate W1, thus making the central portion of the first substrate W1 protruded.

The air supply 103 (the example of the curvature adjuster) is configured to adjust a curvature of the first substrate W1 (the example of the substrate) pressed by the striker 102 (the example of the pressing member). The air supply 103 is, by way of non-limiting example, an electro-pneumatic regulator, and supplies the high-pressure air from the blow-out hole 110*d* (an example of the curvature adjuster) via the blow-out line 131. To be specific, the air supply 103 (the example of the curvature adjuster) supplies the air (an example of a gas) toward the first substrate W1 (the example of the substrate) pressed by the striker 102. The blow-out hole 110*d* (the example of the curvature adjuster) is plural in number, and these blow-out holes 110*d* are arranged along the circumferential direction of the holder 101. That is, the high-pressure air is supplied toward the first substrate W1 from the multiple blow-out holes 110d. Further, each blow-out hole 110d (the example of the curvature adjuster) is provided between the striker 102 (the example of the pressing member) and the attraction pad 111. As the high-pressure air is supplied from the blow-out holes 110d to the first substrate W1 pressed by the striker 102, the first substrate W1 is bent in overall, having an increased curvature. Specifically, the curvature of the central portion of the first substrate W1 pressed by the striker 102 is increased.

The second chuck 200 is equipped with a holder 201 (an example of a lower holder) and a moving device 202.

The holder 201 (the example of the lower holder) is provided under the holder 101. The holder 201 (the example of the lower holder) is configured to hold the second substrate W2 (an example of a substrate) to be bonded with the first substrate W1 attracted to and held by the holder 101. The holder 201 includes a main body 210 and a suction device 211. The main body 210 is formed to have, for example, a circular shape.

The main body 210 is provided with a plurality of pins 220 and a rib 221. The pins 220 are in contact with a bottom surface of the second substrate W2, that is, the non-bonding surface W2n of the second substrate W2. The rib 221 is provided at an outer side than the plurality of pins 220. The rib 221 is formed to have an annular shape to surround the pins 220, and supports a peripheral portion of the second substrate W2 along the entire circumference thereof.

Further, the main body 210 is provided with a suction path 210a. The suction path 210a is plural in number. These suction paths 210a are provided within a region surrounded by the rib 221. The suction paths 210a are connected to the suction device 211 via a suction line 230.

The suction device 211 is, for example, a vacuum pump, and is configured to decompress a suction region surrounded by the rib 211 by vacuum-evacuating the suction region through the multiple suction paths 210a. Accordingly, the second substrate W2 supported by the rib 221 and the pins 220 is attracted to and held by the holder 201.

The moving device 202 is configured to move the holder 210 in the horizontal direction. Further, the moving device 202 is configured to move the holder 201 in the vertical direction and rotate the holder 201 around a vertical axis.

Here, though not shown, the bonding apparatus 41 is further equipped with a transition, an inverting device, a position adjuster, and so forth. The transition is configured to store therein the first substrate W1, the second substrate W2 and the combined substrate T temporarily. The position adjuster is configured to adjust directions of the first substrate W1 and the second substrate W1 in the horizontal direction. The inverting device is configured to invert the front surface and the rear surface of the first substrate W1.

<Bonding Processing>

Figure 4:
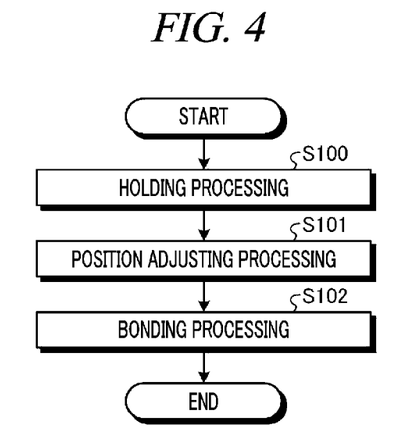
FIG. 4 is a flowchart for describing a bonding processing according to the first exemplary embodiment.

Now, a bonding processing according to the first exemplary embodiment will be explained with reference to a flowchart of FIG. 4. FIG. 4 is the flowchart for describing the bonding processing according to the first exemplary embodiment. Various processings shown in FIG. 4 are performed under the control of the control device 70.

The bonding apparatus 41 performs a holding processing (S100). Specifically, the bonding apparatus 41 attracts and holds the first substrate W1 by the first chuck 100, and attracts and holds the second substrate W2 by the second chuck 200.

The bonding apparatus 41 then performs a position adjusting processing (S101). To elaborate, the bonding apparatus 41 first performs alignment of the first substrate W1 and the second substrate W2 in the horizontal direction, and then moves the holder 201 vertically, thus allowing the second substrate W2 to approach the first substrate W1.

The bonding apparatus 41 then performs a bonding processing (S102). The bonding apparatus 41 makes the central portion of the first substrate W1 protruded toward the second substrate W2, thus allowing the first substrate W1 to be gently curved. To be specific, the bonding apparatus 41 presses the central portion of the substrate W1 by the striker 102. Further, the bonding apparatus 41 supplies the high-pressure air toward the first substrate W1 from the blow-out holes 110d by the air supply 103.

Figure 5:
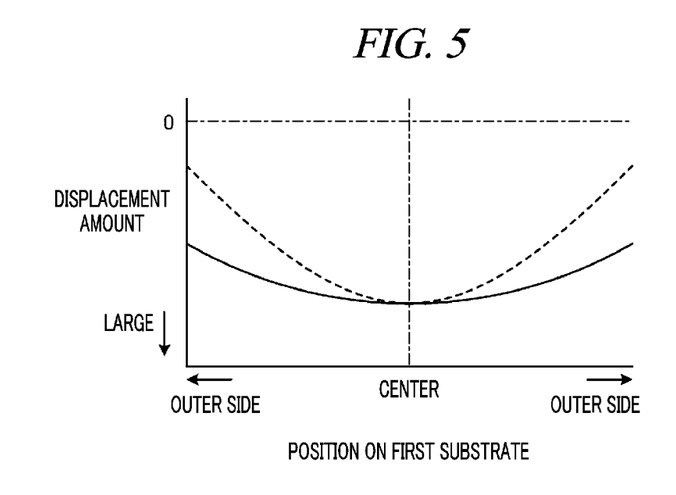
FIG. 5 is a diagram showing a displacement amount of a central portion of the first substrate according to the first exemplary embodiment.

Accordingly, the first substrate W1 is transformed to be protruded toward the second substrate W2 while concentration of a stress to the central portion of the first substrate W1 is suppressed. The first substrate W1 is transformed as illustrated in FIG. 5. FIG. 5 is a diagram showing a displacement amount of the central portion of the first substrate W1. In FIG. 5, a dashed line indicates a displacement amount detected when the central portion of the first substrate W1 is pressed by the striker 102, and a solid line indicates a displacement amount detected when the high-pressure air is further supplied toward the first substrate W1 by the air supply 103. Further, a displacement amount in the state that the first substrate W1 is not curved is assumed to be "0," and each graph indicates a displacement amount of the first substrate W1 in a downward direction.

When the first substrate W1 is pressed by the striker 101, the central portion of the first substrate W1 is intensively pressed by the striker 102. For the reason, a stress is concentrated to the central portion of the first substrate W1, so that a difference in the displacement amount of the first substrate W1 in the diametrical direction thereof increases.

Further, when the high-pressure air is supplied to the first substrate W1 by the air supply 103, a force is applied to the entire first substrate W1 by the high-pressure air. Thus, the concentration of the stress to the central portion of the first substrate W1 is reduced. Accordingly, the difference in the displacement amount of the first substrate W1 in the diametrical direction thereof is reduced. That is, by supplying the high-pressure air toward the first substrate W1 from the air supply 103, the curvature of the first substrate W1 is increased.

Figure 6:
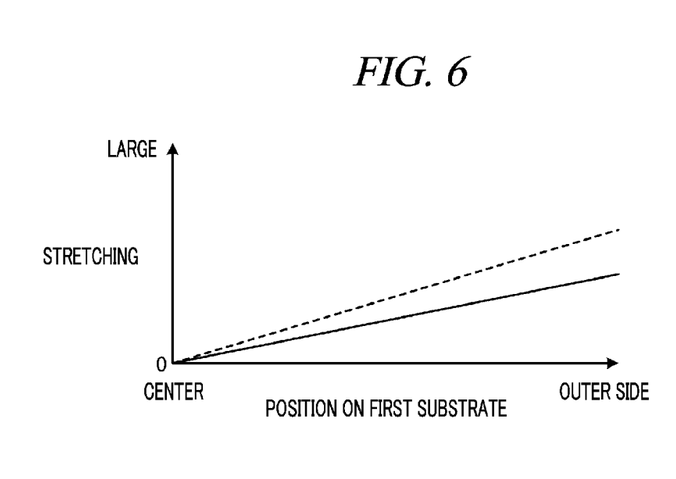
FIG. 6 is a diagram illustrating stretching of the central portion of the first substrate in the bonding processing according to the first exemplary embodiment.

For the reason, stretching of the first substrate W1 near the central portion thereof occurs as illustrated in FIG. 6 with respect to the diametrical direction of the first substrate W1. FIG. 6 is a diagram showing the stretching of the central portion of the first substrate W1 in the bonding processing according to the first exemplary embodiment. In FIG. 6, a dashed line indicates the stretching when the central portion of the first substrate W1 is pressed by the striker 102, and a solid line indicates the stretching when the high-pressure air is further supplied to the first substrate W1 by the air supply 103. Further, in FIG. 6, each graph indicates the stretching with respect to the center of the first substrate W1.

The stretching of the central portion of the first substrate W1 is suppressed when the high-pressure air is supplied by the air supply 103.

As the central portion of the first substrate W1 is gently curved to be protruded toward the second substrate W2, the central portion of the first substrate W1 comes into contact with a central portion of the second substrate W2. Accordingly, bonding of the central portion of the first substrate W1 and the central portion of the second substrate W2 is begun. The surfaces of the first substrate W1 and the second substrate W2 are modified through a surface modifying processing. Therefore, a Van der Waals force (intermolecular force) is generated, and the bonding surface W1j of the first substrate W1 and the bonding surface W2j of the second substrate W2 are bonded. Further, the first substrate W1 and the second substrate W2 are hydrophilized. Therefore, hydrophilic groups of the bonding surface W1j of the first substrate W1 and the bonding surface W2j of the second substrate W2 are hydrogen-bonded, so that the bonding surface W1j of the substrate W1 and the bonding surface W2j of the substrate W2 are firmly bonded.

The bonding apparatus 41 stops the attraction of the first substrate W1 by the attraction pads 111. Specifically, the bonding apparatus 41 stops the suctioning by the suction device 112. Accordingly, the entire first substrate W1 from the central portion and the peripheral portion thereof falls on the second substrate W2. Then, the bonding of the first substrate W1 and the second substrate W2 progress in the entire regions of the first and second substrates W1 and W2 including the central portions and the peripheral portions thereof, so that the combined substrate T is obtained.

<Effects>

The bonding apparatus 41 is equipped with the holder 101, the striker 102 (the example of the pressing member), and the air supply 103 (the example of the curvature adjuster). The holder 102 attracts and holds the first substrate W1 (the example of the substrate) to be bonded. The striker 102 comes into contact with the central portion of the first substrate W1 attracted to and held by the holder 101 and presses the first substrate W1, thus allowing the central portion of the first substrate W1 to be protruded. The air supply 103 adjusts the curvature of the first substrate W1 pressed by the striker 102.

Accordingly, the bonding apparatus 41 can suppress a distortion of the first substrate W1 which is pressed by the striker 102. To be more specific, the bonding apparatus 41 reduces the concentration of the stress to the central portion of the first substrate W1, so that the distortion of the first substrate W1 can be suppressed. Therefore, the bonding apparatus 41 is capable of improving bonding accuracy in the combined substrate T.

The air supply 103 supplies the air toward the first substrate W1 (the example of the substrate) pressed by the striker 102 (the example of the pressing member). To be specific, by supplying the high-pressure air to the first substrate W1, the air supply 103 increases the curvature of the central portion of the first substrate W1 pressed by the striker 102.

Accordingly, the bonding apparatus 41 is capable of reducing the number of positions on the first substrate W1 where the stress is concentrated. Therefore, the bonding apparatus 41 is capable of suppressing the distortion of the first substrate W1 and thus capable of improving the bonding accuracy in the combined substrate T.

Moreover, the bonding apparatus 41 is capable of reducing the number of positions on the first substrate W1 where the stress is concentrated in the entire bonding processing, and thus capable of suppressing the distortion of the first substrate W1. Therefore, the bonding apparatus 41 is capable of improving the bonding accuracy in the combined substrate T.

The multiple blow-out holes 110d (the example of the curvature adjuster) are provided along the circumferential direction of the holder 101.

Accordingly, the bonding apparatus 41 is capable of adjusting the curvature of the first substrate W1 in a balanced manner by the high-pressure air supplied from the blow-out holes 110d. Thus, the bonding apparatus 41 is capable of suppressing the distortion of the first substrate W1 and improving the bonding accuracy in the combined substrate T.

The holder 101 is equipped with the multiple attraction pads 111 provided along the circumferential direction of the holder 101. The blow-out holes 110d are provided between the striker 102 (the example of the pressing member) and the attraction pads 111.

With this configuration, the bonding apparatus 41 is capable of suppressing the distortion of the first substrate W1 which is transformed downwards by being attracted to and held by the attraction pads 111 with its central portion pressed by the striker 102. Therefore, the bonding accuracy in the combined substrate T can be improved.

The bonding apparatus 41 is equipped with the holder 201 (the example of the lower holder). The holder 201 is disposed under the holder 101. The holder 201 holds the second substrate W2 (the example of the substrate) to be bonded to the first substrate W1 (the example of the substrate) attracted to and held by the holder 101.

With this configuration, the bonding apparatus 41 is capable of suppressing the position deviation between the first substrate W1 and the second substrate W2 when the first substrate W1 and the second substrate W2 are bonded, thus capable of improving the bonding accuracy in the combined substrate T.

Second Exemplary Embodiment

Figure 7:
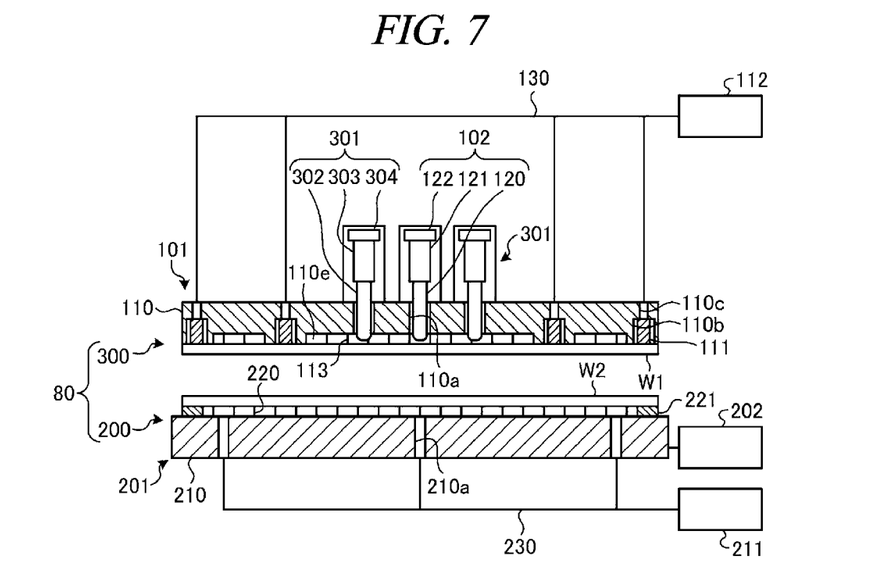
FIG. 7 is a schematic diagram illustrating a configuration of a bonding apparatus according to a second exemplary embodiment.

Now, a bonding apparatus 80 according to a second exemplary embodiment will be described with reference to FIG. 7. FIG. 7 is a schematic diagram illustrating a configuration of the bonding apparatus 80 according to the second exemplary embodiment. Here, distinctive features from the first exemplary embodiment will be explained, and parts which are the same as those of the first exemplary embodiment will be assigned reference numerals, and detailed description thereof will be omitted.

A first chuck 300 of the bonding apparatus 80 according to the second exemplary embodiment is equipped with a striker 301 for curvature adjustment (an example of a curvature adjuster) in addition to the striker 102 configured to press the central portion of the first substrate W1. In the following, the striker 102 configured to press the central portion of the first substrate W1 will be referred to as a first striker 102, and the striker 302 for curvature adjustment will be referred to as a second striker 301.

The second striker 301 (the example of the curvature adjuster) comes into contact with the first substrate W1 (the example of the substrate) to press the first substrate W1. The second striker 301 is provided between the first striker 102 and the attraction pads 111 in the diametrical direction of the first substrate W1. The second striker 301 is plural in number, and these second strikers 301 are arranged along the circumferential direction of the first substrate W1. By way of example, the second strikers 301 are equi-spaced along the circumferential direction of the first substrate W1.

A plurality of second strikers 301 may be provided between the first striker 102 and the attraction pads 111.

Like the first striker 102, the second striker 301 is equipped with a pressing pin 302, an actuator 303 and a linearly moving member 304. The second striker 301 presses the first substrate W1 by coming into contact with a portion of the first substrate W1 outer than the central portion which the first striker 102 comes into contact with. The second striker 301 increases the curvature of the first substrate W1 pressed by the first striker 102. To be specific, the second striker 301 increases the curvature of the central portion of the first substrate W1 pressed by the first striker 102.

The bonding apparatus 80 gently curves the first substrate W1 toward the second substrate W2 by the first striker 102 and the second strikers 301, and bonds the first substrate W1 and the second substrate W2, thus forming the combined substrate T.

<Effects>

The second striker 301 (the example of the curvature adjuster) comes into contact with the first substrate W1 (the example of the substrate) to press the first substrate W1.

Accordingly, the bonding apparatus 80 is capable of easily maintaining the shape of the first substrate W1 having the central portion with the increased curvature. Thus, when the first substrate W1 and the second substrate W1 are bonded, the difference in the distortion of the first substrate W1 can be suppressed. Therefore, the bonding apparatus 80 is capable of improving the bonding accuracy in the combined substrate T.

Third Exemplary Embodiment

Figure 8:
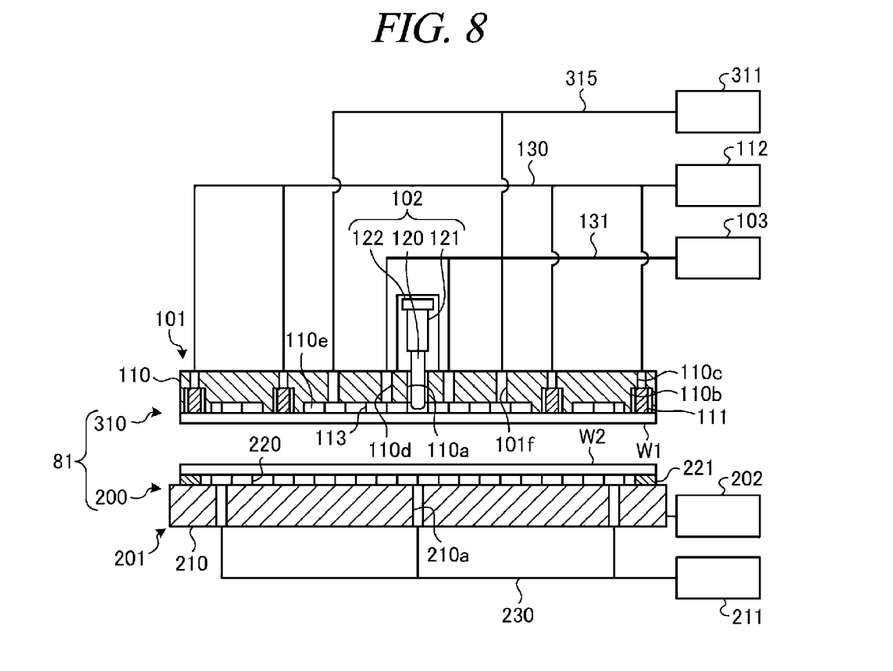
FIG. 8 is a schematic diagram illustrating a configuration of a bonding apparatus according to a third exemplary embodiment.

Now, a bonding apparatus 81 according to a third exemplary embodiment will be explained with reference to FIG. 8. FIG. 8 is a schematic diagram illustrating a configuration of the bonding apparatus 81 according to the third exemplary embodiment. Here, distinctive features from the first exemplary embodiment will be explained, and the same parts as those of the first exemplary embodiment will be assigned same reference numerals, and detailed description thereof will be omitted.

A first chuck 310 of the bonding apparatus 81 according to the third exemplary embodiment is equipped with a suction device 311 in addition to the holder 101, the striker 102 and the air supply 103.

The main body 110 of the holder 101 is provided with a suction hole 101f. The suction hole 101f is formed between the insertion hole 110a; and the accommodation portion 110b and the suction path 110c. The suction hole 101f is plural in number. These suction holes 101f are formed along the circumferential direction of the main body 110. Further, the suction holes 101f may be formed along the diametrical direction of the main body 110. Furthermore, the suction holes 101f may be formed between the accommodation portions 110b which are provided in two circles in the diametrical direction of the main body 110.

The suction holes 101f are connected to the suction device 311 via a suction line 315. In the following, the suction device 112 for attracting and holding the first substrate W1 by suction pads 111 will be referred to as a first suction device 112, and the suction device 311 for performing suctioning through the suction holes 101f will be referred to as a second suction device 311.

The second suction device 311 is, by way of non-limiting example, a vacuum pump, and sucks in air between the first substrate W1 and the holder 101. To elaborate, the second suction device 311 sucks in the air between the first substrate W1 and the holder 101 when the first substrate W1 and the second substrate W2 are bonded. That is, the second suction device 311 sucks in the air at the side of the non-bonding surface Win of the first substrate W1 (the example of the substrate) pressed by the striker 102 (the example of the pressing member).

The bonding apparatus 81 adjusts, by using the air supply 103 and the second suction device 311, the stress applied to the first substrate W1 when the first substrate W1 and the second substrate W2 are bonded by pressing the first substrate W1 with the striker 102. The bonding apparatus 81 adjusts the stress applied to the first substrate W1 by the air supply 103 and the second suction device 311 during a period until the bonding between the first substrate W1 and the second substrate W1 is completed after the first substrate W1 is pressed by the striker 102 in the bonding processing. The bonding apparatus 81 adjusts the stress applied to the first substrate W1 by the air supply 103 and the second suction device 311 depending on a degree of progress of the bonding processing.

Furthermore, the bonding apparatus 81 adjusts a velocity of the first substrate W1 when the first substrate W1 falls in the bonding processing. Specifically, the bonding apparatus 81 reduces the drop velocity of the first substrate W1 by sucking in the air between the first substrate W1 and the holder 101 with the second suction device 311.

<Effects>

The bonding apparatus 81 is equipped with the second suction device 311 (an example of a suction unit). The second suction device 311 sucks in the air at the side of the non-bonding surface Win of the first substrate W1 (the example of the substrate) pressed by the striker 102 (the example of the pressing member).

With this configuration, the bonding apparatus 81 is capable of adjusting the stress applied to the first substrate W1 in the bonding processing, and thus capable of suppressing the distortion of the first substrate W1. To elaborate, the bonding apparatus 81 is capable of adjusting the stress applied to the first substrate W1 based on the degree of progress of the bonding of the first substrate W1 and the second substrate W2. Thus, the bonding apparatus 81 is capable of suppressing the distortion of the first substrate W1 in the entire bonding processing from the beginning of the bonding of the first substrate W1 and the second substrate W2 until the completion of the bonding. Therefore, the bonding accuracy in the combined substrate T can be improved.

Moreover, in the bonding processing, when the first substrate W1 falls as the attraction of the first substrate W1 by the attraction pads 111 is stopped, a bonding speed at the peripheral portion of the first substrate W1 is increased. As a result, a rapid pressure variation occurs in a space between the bonding surface W1j of the first substrate W1 and the bonding surface W2j of the second substrate W2, so that a condensation is formed on the bonding surface W1j of the first substrate W1 and the bonding surface W2j of the second substrate W2. Since moisture caused by this condensation is caught between the first substrate W1 and the second substrate W2, there is a concern that a void (edge void) may be formed along the entire circumference of the peripheral portion of the combined substrate T obtained by the bonding of the first and second substrates.

The bonding apparatus 81 sucks in the air between the first substrate W1 and the holder 101 by the second suction device 311 in the bonding processing, and is thus capable of suppressing the formation of the void at the peripheral portion of the combined substrate T.

In addition, the second suction device 311 may be plural in number. These second suction devices 311 suck in the air between the first substrate W1 and the holder 101 by different suction forces for different positions on the first substrate W1. Further, the bonding apparatus 81 may be equipped with valves or the like and suck in the air between the first substrate W1 and the holder 101 by different suction forces for different positions on the first substrate W1 by adjusting the valves.

By way of example, when the distortion of the first substrate W1 occurs periodically along the circumferential direction of the first substrate W1, the amount of the air sucked from each suction hole 101*f* may be adjusted based on a characteristic of the distortion of the first substrate W1 by using the multiple suction devices 311. Accordingly, the bonding apparatus 81 is capable of adjusting the displacement amount of the first substrate W1 based on the characteristic of the distortion of the first substrate W1, and thus capable of improving the bonding accuracy in the combined substrate T.

Fourth Exemplary Embodiment

Figure 9:
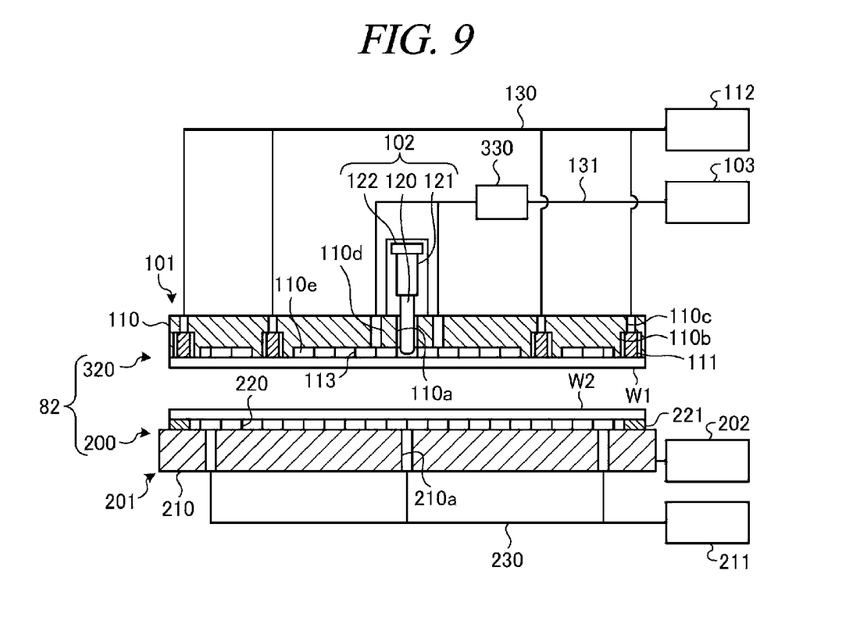
FIG. 9 is a schematic diagram illustrating a configuration of a bonding apparatus according to a fourth exemplary embodiment.

Now, a bonding apparatus 82 according to a fourth exemplary embodiment will be discussed with reference to FIG. 9. FIG. 9 is a schematic diagram illustrating a configuration of the bonding apparatus 82 according to the fourth exemplary embodiment. Here, distinctive features from the first exemplary embodiment will be explained, and the same parts as those of the first exemplary embodiment will be assigned same reference numerals, and detailed description thereof will be omitted.

A first chuck 320 of the bonding apparatus 82 according to the fourth exemplary embodiment 82 is equipped with a temperature controller 330 in addition to the holder 101, the striker 102 and the air supply 103.

The temperature controller 330 is configured to adjust a temperature of the air (the example of the gas) supplied from the blow-out holes 110*d* by the air supply 103. The temperature controller 330 is provided at the blow-out line 131. The temperature controller 330 is, by way of non-limiting example, a heater, and heats the air. Further, the temperature controller 330 may cool the air. Further, the temperature controller 330 may be plural in number. For example, the bonding apparatus 82 may supply the air having different temperatures toward the first substrate W1 from the blow-out holes 110*d* by the multiple temperature controllers 330.

The bonding apparatus 82 adjusts a temperature of the first substrate W1 by adjusting the temperature of the air supplied from the blow-out holes 110*d* in the bonding processing.

<Effects>

The bonding apparatus 82 is equipped with the temperature controller 330. The temperature controller 330 adjusts the temperature of the air (the example of the gas) discharged by the air supply 103.

Accordingly, the bonding apparatus 82 is capable of suppressing non-uniformity in the stretching and the shrink of the first substrate W1 when the first substrate W1 and the second substrate W2 are bonded. Therefore, the bonding apparatus 82 is capable of improving the bonding accuracy in the combined substrate T.

Modification Example

In the bonding apparatus (41, 80, 81, 82) according to a modification example, the blow-out holes 110*d* and the attraction pads 111 may be arranged alternately in the circumferential direction of the first substrate W1. Further, in the bonding apparatus (41, 80, 81, 82) according to the modification example, the multiple blow-out holes 110*d* may be set as one group, and the multiple attraction pads 111 may be set as another group. Further, in the bonding apparatus (41, 80, 81, 82) according to the modification example, the group of the blow-out holes 110*d* and the group of the attraction pads 111 may be arranged alternately in the circumferential direction of the first substrate W1.

With this configuration, the bonding apparatus (41, 80, 81, 82) according to the modification example is capable of adjusting the displacement amount of the first substrate W1 independently at different positions of the first substrate W1. By way of example, when the distortion of the first substrate W1 occurs periodically along the circumferential direction of the first substrate W1, the bonding apparatus (41, 80, 81, 82) according to the modification example is capable of adjusting the displacement amount of the first substrate W1 based on the characteristic of the distortion of the first substrate W1. Therefore, the bonding apparatus (41, 80, 81, 82) according to the modification example is capable of improving the bonding accuracy in the combined substrate T.

In addition, the bonding apparatuses 41, 80, 81 and 82 according to the above-described exemplary embodiments may be combined. By way of example, the second striker 301 according to the second exemplary embodiment and the second suction device 311 according to the third exemplary embodiment may be combined. As another example, the second striker 301 according to the second exemplary embodiment and the temperature controller 330 according to the fourth exemplary embodiment may be combined. Further, the second suction device 311 according to the third exemplary embodiment and the temperature controller 330 according to the fourth exemplary embodiment may be combined.

In the bonding apparatus (41, 80, 81, 82) according to the modification example, the first substrate W1 and the second substrate W2 may be bonded by protruding the central portion of the second substrate W2 toward the first substrate W1. For instance, in the bonding apparatus (41, 80, 81, 82) according to the modification example, the central portion of the second substrate W2 may be pressed by the striker, and the curvature of the pressed second substrate W2 may be increased by the air supply.

Here, it should be noted that the above-described exemplary embodiments are illustrative in all aspects and are not anyway limiting. In fact, the above-described exemplary embodiments can be embodied in various forms. Further, the above-described exemplary embodiments may be omitted, replaced and modified in various ways without departing from the scope and the spirit of claims.

According to the exemplary embodiment, it is possible to improve bonding accuracy for the substrate.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting. The scope of the inventive concept is defined by the following claims and their equivalents rather than by the detailed description of the exemplary embodiments. It shall be understood that all modifications and embodiments conceived from the meaning and scope of the claims and their equivalents are included in the scope of the inventive concept.

We claim:
1. A bonding apparatus, comprising:
a holder configured to attract and hold a substrate to be bonded;
a pressing member configured to come into contact with a central portion of a first surface of the substrate attracted to and held by the holder and press the substrate to allow the central portion of the substrate to be protruded; and a curvature adjuster configured to adjust a curvature of the substrate pressed by the pressing member by supplying gas toward the first surface of the substrate pressed by the pressing member.

2. The bonding apparatus of claim 1, further comprising:
a temperature adjuster configured to adjust a temperature of the gas.

3. The bonding apparatus of claim 1,
wherein the curvature adjuster is configured to come into contact with the substrate to press the substrate.

4. The bonding apparatus of claim 1,
wherein the curvature adjuster includes multiple curvature adjusters, and the multiple curvature adjusters are provided along a circumferential direction of the holder.

5. The bonding apparatus of claim 1,
wherein the holder comprises multiple attraction pads provided along a circumferential direction of the holder, and the curvature adjuster is provided between the pressing member and the attraction pads.

6. The bonding apparatus of claim 1, further comprising:
a suction device configured to suck in air at a non-bonding surface of the substrate pressed by the pressing member.

7. The bonding apparatus of claim 1, further comprising:
a lower holder disposed under the holder and configured to hold a substrate to be bonded to the substrate attracted to and held by the holder.

8. A bonding method, comprising:
attracting and holding a substrate to be bonded;

pressing the substrate by a pressing member configured to come into contact with a central portion of a first surface of the substrate which is attracted and held; and adjusting a curvature of the substrate pressed by the pressing member by supplying gas toward the first surface of the substrate pressed by the pressing member.

* * * * *

UNITED STATES PATENT AND TRADEMARK OFFICE
CERTIFICATE OF CORRECTION

| | |
|---|---|
| PATENT NO. | : 11,837,574 B2 |
| APPLICATION NO. | : 17/320338 |
| DATED | : December 5, 2023 |
| INVENTOR(S) | : Kenji Sugakawa et al. |

It is certified that error appears in the above-identified patent and that said Letters Patent is hereby corrected as shown below:

In the Specification

Column 6, Line 4, "Win" should be -- W1n --.

Column 6, Line 20, "Win" should be -- W1n --.

Column 11, Line 61, "Win" should be -- W1n --.

Column 12, Line 22, "Win" should be -- W1n --.

Signed and Sealed this
Sixth Day of August, 2024

Katherine Kelly Vidal
*Director of the United States Patent and Trademark Office*